US012704531B2

(12) United States Patent
Lee et al.

(10) Patent No.: US 12,704,531 B2
(45) Date of Patent: Aug. 11, 2026

(54) CURRENT-DETECTING METHOD FOR OVERCOMING THE LIMITATIONS OF LOWER-ARM CURRENT DETECTION

(71) Applicant: Delta Electronics, Inc., Taoyuan City (TW)

(72) Inventors: Yu-Ling Lee, Taoyuan City (TW); Ching-Chang Chen, Taoyuan City (TW); Shih-Hao Huang, Taoyuan City (TW); Zhi-Xiang Liu, Taoyuan City (TW); Yu-Shian Lin, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 225 days.

(21) Appl. No.: 18/601,166

(22) Filed: Mar. 11, 2024

(65) Prior Publication Data

US 2024/0329100 A1 Oct. 3, 2024

Related U.S. Application Data

(60) Provisional application No. 63/455,360, filed on Mar. 29, 2023.

(30) Foreign Application Priority Data

Dec. 1, 2023 (CN) ........................ 202311633723.0

(51) Int. Cl.
*G01R 19/00* (2006.01)

(52) U.S. Cl.
CPC ................................ *G01R 19/0046* (2013.01)

(58) Field of Classification Search
CPC .. G01R 19/0046; G01R 31/343; G01R 31/42; G01R 19/0092; H02M 1/0009
USPC ...................................... 324/123, 76.11, 500
See application file for complete search history.

(56) References Cited

U.S. PATENT DOCUMENTS

| | | | | |
|---|---|---|---|---|
| 8,264,190 | B2 | 9/2012 | Suzuki | |
| 8,605,461 | B2 | 12/2013 | Hibino | |
| 10,852,224 | B2 * | 12/2020 | Espejord ................ | G01N 17/04 |
| 11,824,344 | B1 * | 11/2023 | Parkhideh .............. | G01R 31/52 |
| 2003/0173946 | A1 | 9/2003 | Liu et al. | |
| 2015/0008860 | A1 | 1/2015 | Lee | |
| 2016/0254760 | A1 | 9/2016 | Zhang et al. | |

(Continued)

FOREIGN PATENT DOCUMENTS

| | | | |
|---|---|---|---|
| CN | 102577070 | A | 7/2012 |
| CN | 104283481 | A | 1/2015 |

*Primary Examiner* — Giovanni Astacio-Oquendo
(74) *Attorney, Agent, or Firm* — MUNCY, GEISSLER, OLDS & LOWE, P.C.

(57) ABSTRACT

A current detection method adapted to an inverter is provided, which includes: determining that a plurality of lower arms of an inverter have a minimum conduction period when all the lower arms are turned on simultaneously; determining a sampling time point according to the minimum conduction period, wherein a period from a starting point of the minimum conduction period to the sampling time point is defined as a sampling period that is close to the minimum conduction period; simultaneously detecting currents flowing through the lower arms by a plurality of detection resistors to generate a plurality of measurement voltages; and determining the currents of the inverter according to the measurement voltages.

19 Claims, 9 Drawing Sheets

(56) References Cited

U.S. PATENT DOCUMENTS

| | | | | |
|---|---|---|---|---|
| 2018/0062523 | A1* | 3/2018 | Rainer | H02M 3/33507 |
| 2020/0280278 | A1* | 9/2020 | Tamura | H02P 29/028 |
| 2021/0384861 | A1* | 12/2021 | Shin | G01R 1/203 |
| 2023/0012533 | A1* | 1/2023 | Huang | G01R 35/005 |
| 2023/0273013 | A1* | 8/2023 | Aykac | G01B 11/303<br>702/127 |

* cited by examiner

CURRENT-DETECTING METHOD FOR OVERCOMING THE LIMITATIONS OF LOWER-ARM CURRENT DETECTION

CROSS REFERENCE TO RELATED APPLICATIONS

This application claims the benefit of U.S. Provisional Application No. 63/455,360, filed on Mar. 29, 2023, the entirety of which is incorporated by reference herein.

This Application claims priority of China Patent Application No. 202311633723.0, filed on Dec. 1, 2023, the entirety of which is incorporated by reference herein.

BACKGROUND OF THE INVENTION

Field of the Invention

The disclosure is generally related to a current-detecting method, which is a method for detecting the current of an inverter; more specifically it is related to a current-detecting method for overcoming the limitations of lower-arm current detection by selecting the timing of data sampling, compensating the sampled signals, limiting the pulse width, and compensating the limited pulse width.

Description of the Related Art

The lower-arm current detection (leg-shunt) resistor is one of a variety of current sampling structures used in detecting the current of an inverter. It has a significant advantage in terms of the cost of components, especially compared to a Hall sensor, and it can reduce the cost of an isolated circuit design compared to output-shunt resistors. Thus, it is widely used in cost-sensitive low-power inverters. However, although the lower-arm current detection resistor architecture has significant advantages in terms of cost, it also has a significant disadvantage: the current can only be detected when the current flows through the lower-arm power elements (such as IGBT, etc.). There are also certain limitations on timing to sample the current and pulse width modulation design.

Generally speaking, a current sampling point is selected when all three lower-arm power elements are turned on, that is, when the voltage output phasor is a zero vector (i.e., (0,0,0)), no matter the polarity of the output current is positive or negative can be detected by the detection resistor. However, when the frequency converter operates in nonlinear modulation, since the pulse width modulation is going to enter a state consisting of effective vectors, the output voltage vector in an electrical cycle does not always have a zero vector, so that there is a region that the currents of three phases cannot be simultaneously detected.

To deal with the above situation, one of the known methods is to assume that the current does not have a zero vector component (that is, the sum of the three-phase currents is zero), and the feedback currents of two phases can still be effectively sampled to synthesize the current of an undetectable phase. However, this approach will cause the synthesized third-phase current to carry all the noise of the feedback signals of the other two phases, and will also cause the response speed of control functions such as ground leakage detection or disconnection detection to slow down, or even invalid. In addition, in order to solve the problem of signal interference between the feedback circuits of the lower-arm current detection resistors, when using a filter as a solution to avoid sampling anomalies, sampling before the stabilization period of the filter will result in a more accurate signal than a result of the attenuation, the stabilization period of the filter is considered as the lower-arm minimum pulse width condition, which further exacerbates the aforementioned problems.

BRIEF SUMMARY OF THE INVENTION

A current measurement method and a compensation method for an inverter are proposed herein. By limiting the minimum conduction period of the lower arms and the upper arms and compensating for the adjustment of the conduction period, there is always a zero vector in each electrical cycle for simultaneously detecting the currents of three phases. In addition, by selecting the sampling time point and compensating for the attenuation of the filter, it not only helps to further shorten the minimum conduction period, but also can accurately obtain the currents flowing through the lower arms during the minimum conduction period.

In an embodiment, a current detection method adapted to an inverter is provided, which comprises the following steps. It is determined that a plurality of lower arms has a minimum conduction period when the lower arms of the inverter are turned on simultaneously. A sampling time point is determined according to the minimum conduction period. A sampling period is defined as the period from a starting point of the minimum conduction period to the sampling time point. The sampling period is close to the minimum conduction period. Currents flowing through the lower arms are simultaneously detected by a plurality of detection resistors to generate a plurality of measurement voltages. The measurement voltages are sampled at the sampling time point. Currents of the inverter are determined according to the sampled measurement voltages.

In another embodiment, a current detection method adapted to an inverter is provided, which comprises the following steps. A compensation method is executed, and the compensation method comprises the following steps. It is determined whether conduction periods of a plurality of lower arms of the inverter are lower than a lower limit value when the lower arms are turned on simultaneously. A first difference is calculated when it is determined that a first conduction period of a first lower arm of the inverter is less than the lower limit value. The first difference is equal to a difference between a lower limit set value and the first conduction period. The first difference is added to the conduction periods of other lower arms of the inverter. The minimum conduction period of the lower arms is updated after the compensation method is executed. The currents flowing through the lower arms are simultaneously detected to generate a plurality of measurement voltages by a plurality of detection resistors during the minimum conduction period. The currents of the inverter is determined according to the measurement voltages.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
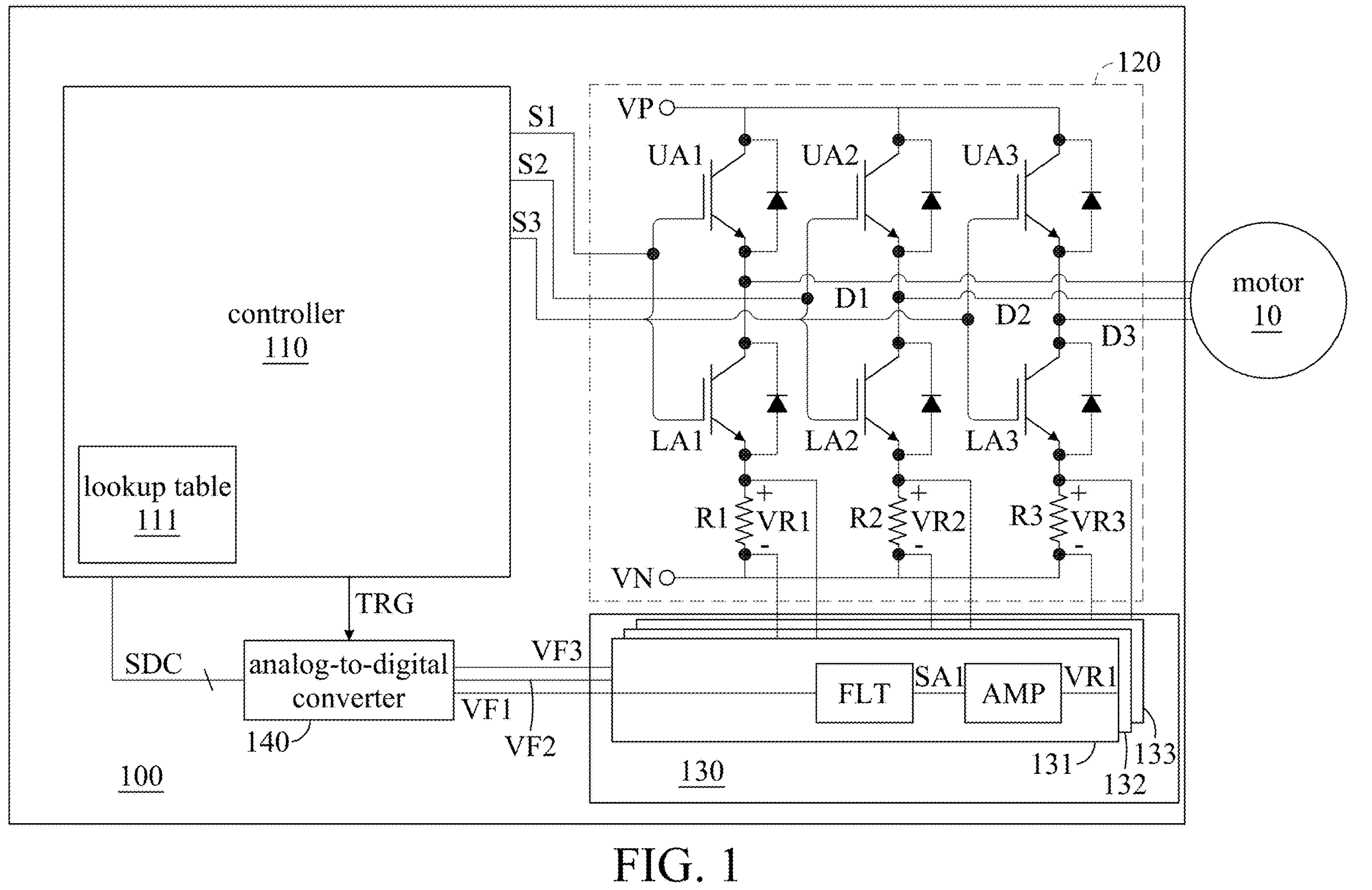
FIG. 1 is a block diagram showing a motor driving circuit in accordance with an embodiment of the present invention.

The following description is made for the purpose of illustrating the general principles of the disclosure and should not be taken in a limiting sense. The scope of the disclosure is determined by reference to the appended claims.

In the following detailed description, for purposes of explanation, numerous specific details and embodiments are set forth in order to provide a thorough understanding of the present disclosure. The use of like and/or corresponding numerals in the drawings of different embodiments does not suggest any correlation between different embodiments.

In addition, in this specification, relative spatial expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section in the specification could be termed a second element, component, region, layer, portion or section in the claims without departing from the teachings of the present disclosure.

It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In the drawings, similar elements and/or features may have the same reference number. Various components of the same type can be distinguished by adding letters or numbers after the component symbol to distinguish similar components and/or similar features.

As shown in FIG. 1, the motor driving circuit 100 is configured to drive the motor 10 and includes a controller 110, an inverter 120, a feedback circuit 130, and an analog-to-digital converter 140. The motor driving circuit 100 generates a first phase signal S1, a second phase signal S2, a third phase signal S3, and a trigger signal TRG.

The inverter 120 is powered by the positive voltage level VP and the negative voltage level VN, and generates the first driving signal D1, the second driving signal D2 and the third driving signal D3 to drive the motor 10 based on the first phase signal S1, the second phase signal S2, and the third phase signal S3 output by the controller 110. According to an embodiment of the present invention, the inverter 120 is a three-phase inverter. According to other embodiments of the present invention, the inverter 120 may be a multi-phase inverter. A three-phase inverter is illustrated herein, but not intended to be limited thereto.

As shown in FIG. 1, the inverter 120 includes a first upper arm UA1, a first lower arm LA1, a first resistor R1, a second upper arm UA2, a second lower arm LA2, a second resistor R2, a third upper arm UA3, a third lower arm LA3, and a third resistor R3. The first upper arm UA1, the first lower arm LA1, and the first resistor R1 are coupled between the positive voltage level VP and the negative voltage level VN, and generate the first driving signal D1 according to the first phase signal S1.

The second upper arm UA2, the second lower arm LA2, and the second resistor R2 are coupled between the positive voltage level VP and the negative voltage level VN, and generate the second driving signal D2 according to the second phase signal S2. The third upper arm UA3, the third lower arm LA3, and the third resistor R3 are coupled between the positive voltage level VP and the negative voltage level VN, and generate the third driving signal D3 according to the third phase signal S3.

According to an embodiment of the present invention, the first resistor R1, the second resistor R2, and the third resistor R3 are configured to detect the currents flowing through the first lower arm LA1, the second lower arm LA2, and the third lower arm LA3 to generate the first measurement voltage VR1, the second measurement voltage VR2, and the third measurement voltage VR3 respectively.

The feedback circuit 130 includes a first feedback circuit 131, a second feedback circuit 132, and a third feedback circuit 133. The first feedback circuit 131, the second feedback circuit 132, and the third feedback circuit 133 respectively generate the first feedback voltage VF1, the second feedback voltage VF2, and the third feedback voltage VF3 according to the first measurement voltage VR1, the second measurement voltage VR2, and the third measurement voltage VR3 respectively.

Each of the first feedback circuit 131, the second feedback circuit 132, and the third feedback circuit 133 includes an amplifier AMP and a filter FLT. As shown in FIG. 1, after the first feedback circuit 131 receives the first measurement voltage VR1, the amplifier AMP amplifies the first measurement voltage VR1 with the amplification gain G to generate the first amplified signal SAL. The filter FLT then processes the first amplified signal SA1 to generate the first feedback voltage VF1. The second feedback circuit 132 and the third feedback circuit 133 amplify and filter the second measurement voltage VR2 and the third measurement circuit VR3 to generate the second feedback voltage VF2 and the third feedback voltage VF3 respectively.

According to other embodiments of the present invention, any one of the first feedback circuit 131, the second feedback circuit 132, and the third feedback circuit 133 may not include the amplifier AMP. In other words, the filter FLT processes the received first measurement voltage VR1, second measurement voltage VR2, and third measurement voltage VR3 to generate the first feedback voltage VF1, the second feedback voltage VF2, and the third feedback voltage VF3 accordingly. It is assumed that the first feedback circuit 131, the second feedback circuit 132, and the third feedback circuit 133 each includes an amplifier AMP herein is for explanation, but not intended to be limited thereto.

The analog-to-digital converter 140 samples the first feedback voltage VF1, the second feedback voltage VF2, and the third feedback voltage VF3 according to the trigger signal TRG, and converts the first feedback voltage VF1, the second feedback voltage VF2, and the third feedback voltage VF3 into a respective digital current signal SDC and provides the digital current signal SDC to the controller 110.

According to an embodiment of the present invention, the controller 110 further includes a lookup table 111. The controller 110 learns the current flowing through the first lower arm LA1, the second lower arm LA2, and the third lower arm LA3 based on the digital current signal SDC and the relationship between the digital current signal SDC and the current in the lookup table 111.

Figures 2, 3:
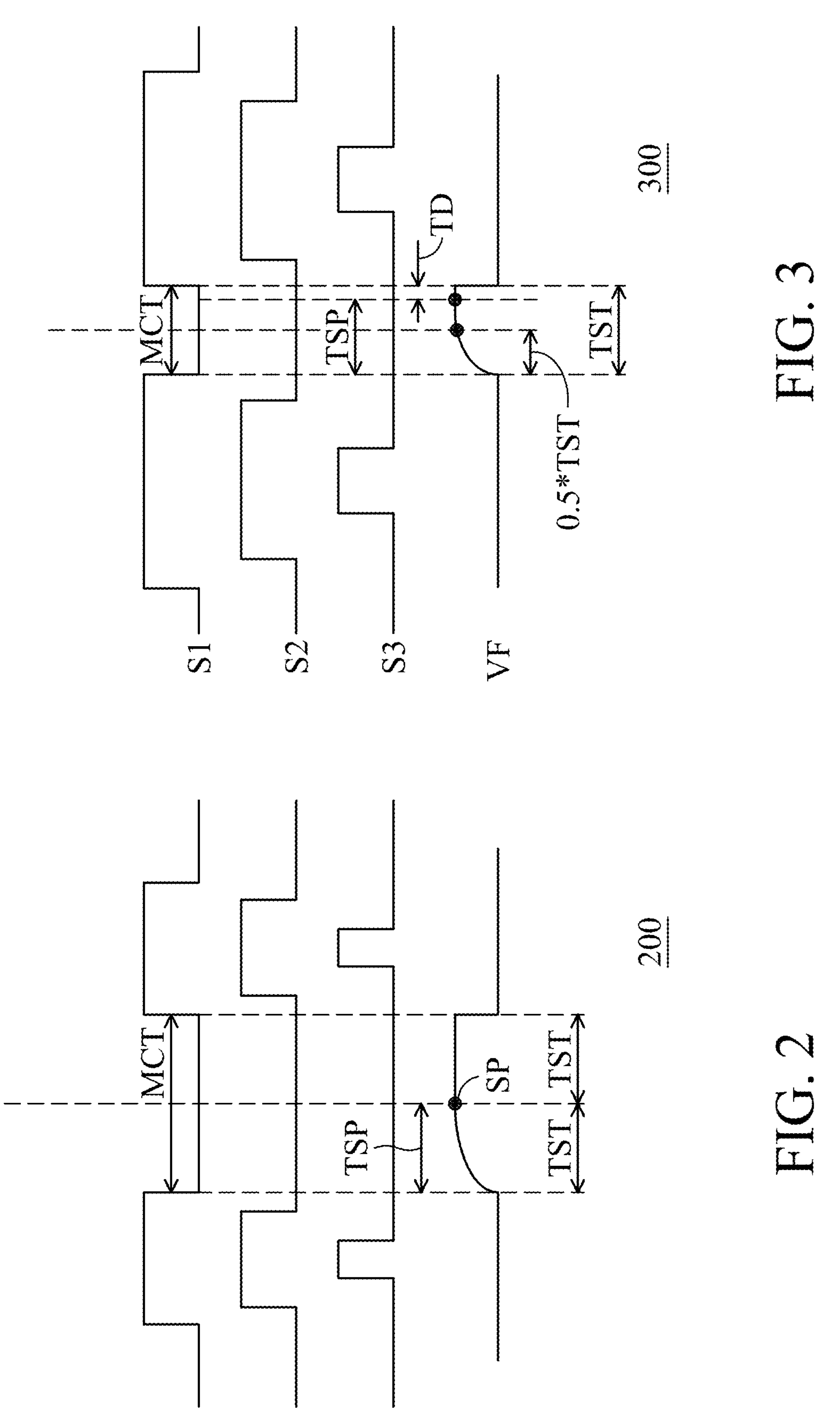
FIG. 2 is a timing diagram showing the sampling time point in accordance with an embodiment of the present invention.
FIG. 3 is a timing diagram showing the sampling time point in accordance with another embodiment of the present invention.

As shown in the timing diagram 200 of FIG. 2, when the first phase signal S1, the second phase signal S2, and the third phase signal S3 of FIG. 1 are all at the low logic level, the analog-to-digital converter 140 samples the first feedback signal VF1, the second feedback signal VF2, and the third feedback signal VF3 according to the trigger signal TRG.

As shown in FIG. 2, the feedback signal VF is configured to represent any one of the first feedback signal VF1, the second feedback signal VF2, and the third feedback signal VF3. According to an embodiment of the present invention, when any one of the first phase signal S1, the second phase signal S2, and the third phase signal S3 is at a low logic level, the corresponding first lower arm LA1, second lower arm LA2, and third lower arm LA3 in FIG. 1 is/are turned on.

As shown in FIG. 2, when the first phase signal S1, the second phase signal S2, and the third phase signal S3 are all at the low logic level, since the first phase signal S1 is at the low logic level for the shortest period, it indicates that the first lower arm LA1 in FIG. 1 has a minimum conduction period MCT. When the analog-to-digital converter 140 samples the feedback signal VF (i.e., any one of the first feedback signal VF1, the second feedback signal VF2, and the third feedback signal VF3), in order to avoid sampling an unstable value, the sampling time point SP is located in the middle of the minimum conduction period MCT. In other words, the sampling period TSP is half of the minimum conduction period MCT.

In addition, since the feedback signal VF is processed by the filter FLT and the filter FLT has the signal stabilization period TST, plus that in order to sample the stable feedback signal VF, the minimum sampling period TSP is set to be the stabilization period TST. Furthermore, since the sampling period TSP is half of the minimum conduction period MCT, the minimum conduction period MCT is twice of the stabilization period TST. In other words, under this sampling method, the minimum conduction period MCT of the first lower arm LA1, the second lower arm LA2, and the third lower arm LA3 would be limited to no less than twice of the stabilization period TST of the filter FLT.

As shown in the timing diagram 300 of FIG. 3, the sampling period TSP is shortened to be less than the stabilization period TST of the filter FLT, so that the minimum conduction period MCT is shortened accordingly. According to an embodiment of the present invention, in order to ensure that the analog-to-digital converter 140 samples a correct value, the sampling time point SP is set to be the time point prior to the end point of the minimum conduction period MCT by the delay time TD. In other words, the minimum conduction period MCT ends after the sampling time point SP passes the delay time TD. Compared with the embodiment of FIG. 2, the minimum conduction period MCT of the embodiment of FIG. 3 can be shortened to the stabilization period TST.

According to an embodiment of the present invention, the sampling period TSP is not less than half of the stabilization period TST. In other words, the sampling time point SP is close to the stabilization period TST, which helps the analog-to-digital converter 140 to sample a value closer to a stable value. According to other embodiments of the present invention, the sampling period TSP may also be less than half of the stabilization period TST, and a corresponding compensation method is also required.

Figure 4:
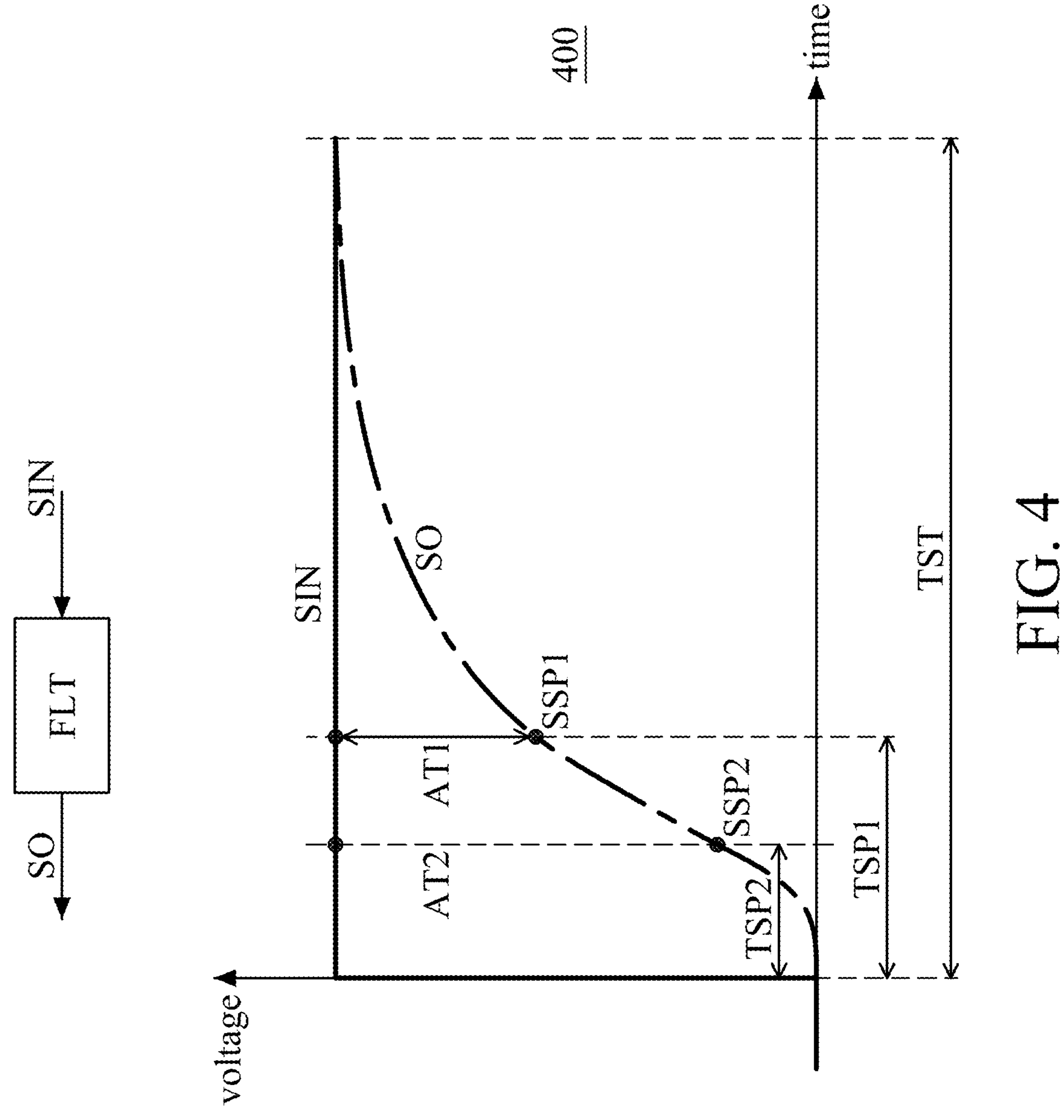
FIG. 4 is a schematic diagram showing signal attenuation of a filter in accordance with an embodiment of the present invention.

As shown in FIG. 4, the filter FLT receives the input signal SIN to generate the output signal SO. According to an embodiment of the present invention, the filter FLT in FIG. 4 corresponds to the filter FLT in FIG. 1, the input signal SIN corresponds to the first amplified signal SA1, and the output signal SO corresponds to the first feedback signal SF1.

As shown in the signal attenuation diagram 400 in FIG. 4, after the stabilization period TST, the voltage value of the output signal SO is very close to the voltage value of the input signal SIN. According to an embodiment of the present invention, after the stabilization period TST, the voltage value of the output signal SO is not less than 99% of the voltage value of the input signal SIN.

When the sampling period TSP is less than the stabilization period TST, the sampling signals of different sampling periods correspond to different attenuation amounts. As shown in FIG. 4, when sampling is performed at the first sampling time point TSP1, there is a first attenuation amount AT1 between the first sampling signal SSP1 of the output signal SO and the corresponding input signal SIN. When sampling is performed at the second sampling time point TSP2, there is a second attenuation amount AT2 between the second sampling signal SSP2 of the output signal SO and the corresponding input signal SIN.

In order to more accurately restore the current flowing through the first lower arm LA1, the second lower arm LA2, and the third lower arm LA3 in FIG. 1, the lookup table 111 in FIG. 1 is configured to establish the relationship between the sampling period, the sampling signal, and the current of each lower arm in FIG. 1; specifically, the first lower arm LA1, the second lower arm LA2, and the third lower arm LA3. In other words, when the analog-to-digital converter 140 in FIG. 1 samples the first sampling signal SSP1 at the first sampling time point TSP1, the controller 110 learns based on the lookup table 111 that the current flowing through the first lower arm LA1, the second lower arm LA2, and the third lower arm LA3 is the first current. When the analog-to-digital converter 140 samples the second sampling signal SSP2 at the second sampling time point TSP2, the controller 110 learns based on the lookup table 111 that the current flowing through the first lower arm LA1, the second lower arm LA2, and the third lower arm LA3 is also the first current.

According to an embodiment of the present invention, it is assumed that the allowable feedback error is the first ratio E of the first measurement voltage VR1, the second measurement voltage VR2, and the third measurement voltage VR3 in FIG. 1. The background noise is the second ratio N of the first measurement voltage VR1, the second measurement voltage VR2, and the third measurement voltage VR3 in FIG. 1. The limitation of the amplification gain G of the amplifier AMP is as described in Eq. 1:

$$G \leq \frac{E}{N} \quad \text{(Eq. 1)}$$

In other words, although shortening the sampling period TSP may also shorten the minimum conduction period MCT, a larger amplification gain G of the amplifier AMP may be required to amplify the first measurement voltage VR1, the second measurement voltage VR2, and the third measurement voltage VR3 to a range that the analog-to-digital converter 140 can detect.

In addition, the amplifier AMP will also amplify the background noise. In order to meet the requirement of feedback error, the amplification gain G of the amplifier AMP cannot be increased without limit. In addition, since the maximum value of the amplification gain G is shown in Eq. 1, it is also necessary to limit the minimum conduction period MCT, thereby limiting the minimum sampling period TSP. However, limiting the minimum conduction period MCT will cause the effective vector formed by the first phase signal S1, the second phase signal S2, and the third phase signal S3 to deviate, so the conduction periods of the lower arms (other than the minimum conduction period MCT) must be compensated.

Figures 5A, 5B:
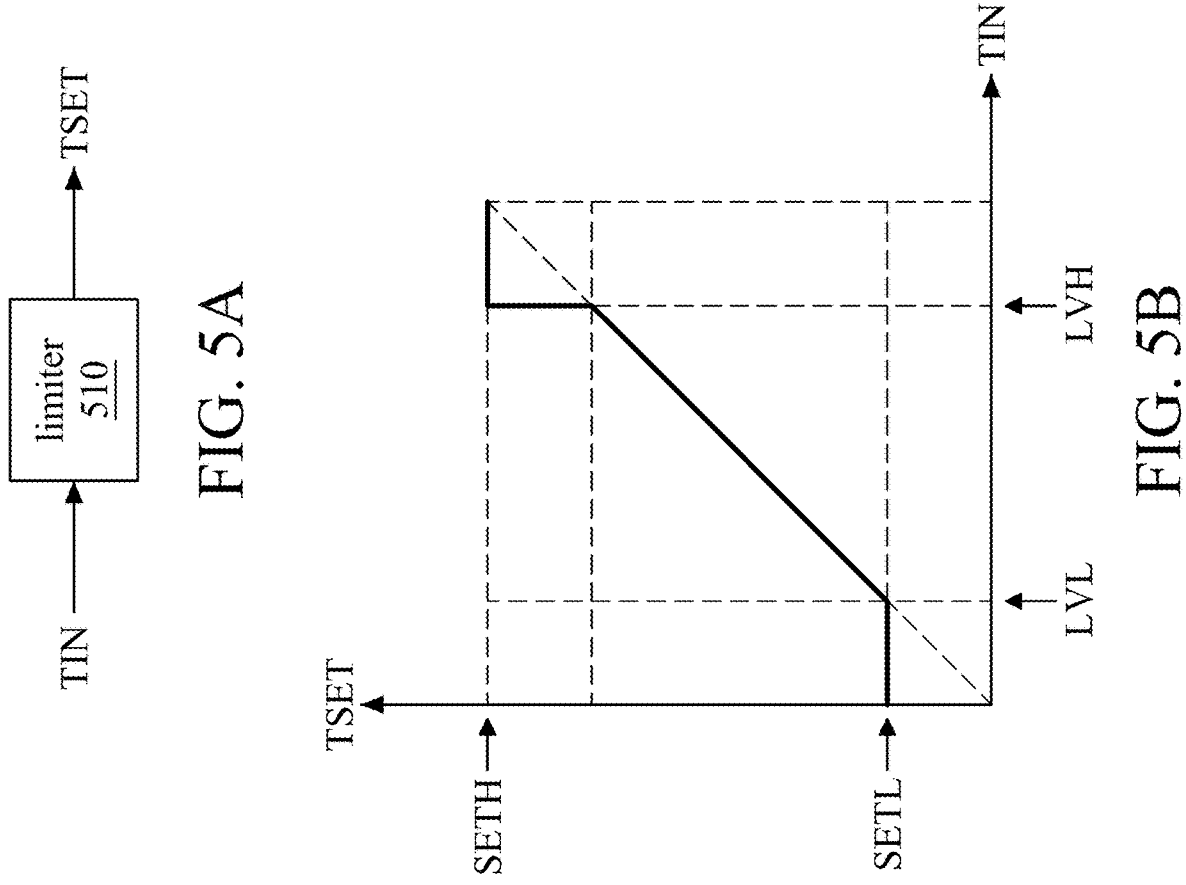
FIGS. 5A-5B are schematic diagrams showing a compensation method for the conduction period of the lower arm of an inverter in accordance with some embodiments of the present invention.

As shown in FIG. 5A, after the input conduction period TIN is limited by the limiter 510, a set conduction period TSET is generated. In other words, after the predetermined conduction period (i.e., the input conduction period TIN) of any one of the first lower arm LA1, the second lower arm LA2, and the third lower arm LA3 in FIG. 1 is limited by the limiter 510, the actual conduction period generated (i.e., the set conduction period TSET). According to some embodiments of the present invention, limiter 510 is part of the algorithm or module of controller 110.

As shown in FIG. 5B, when the input conduction period TIN is not greater than the lower limit value LVL, the set conduction period TSET output by the limiter 510 is the lower limit set value SETL. When the input conduction period TIN is greater than or equal to the upper limit value LVH, the set conduction period TSET output by the limiter 510 is the upper limit set value SETH. In other words, the pulse width of any one of the first lower arm LA1, the second lower arm LA2, and the third lower arm LA3 in FIG. 1 is from the lower limit set value SETL to the upper limit set value SETH.

Figure 6:
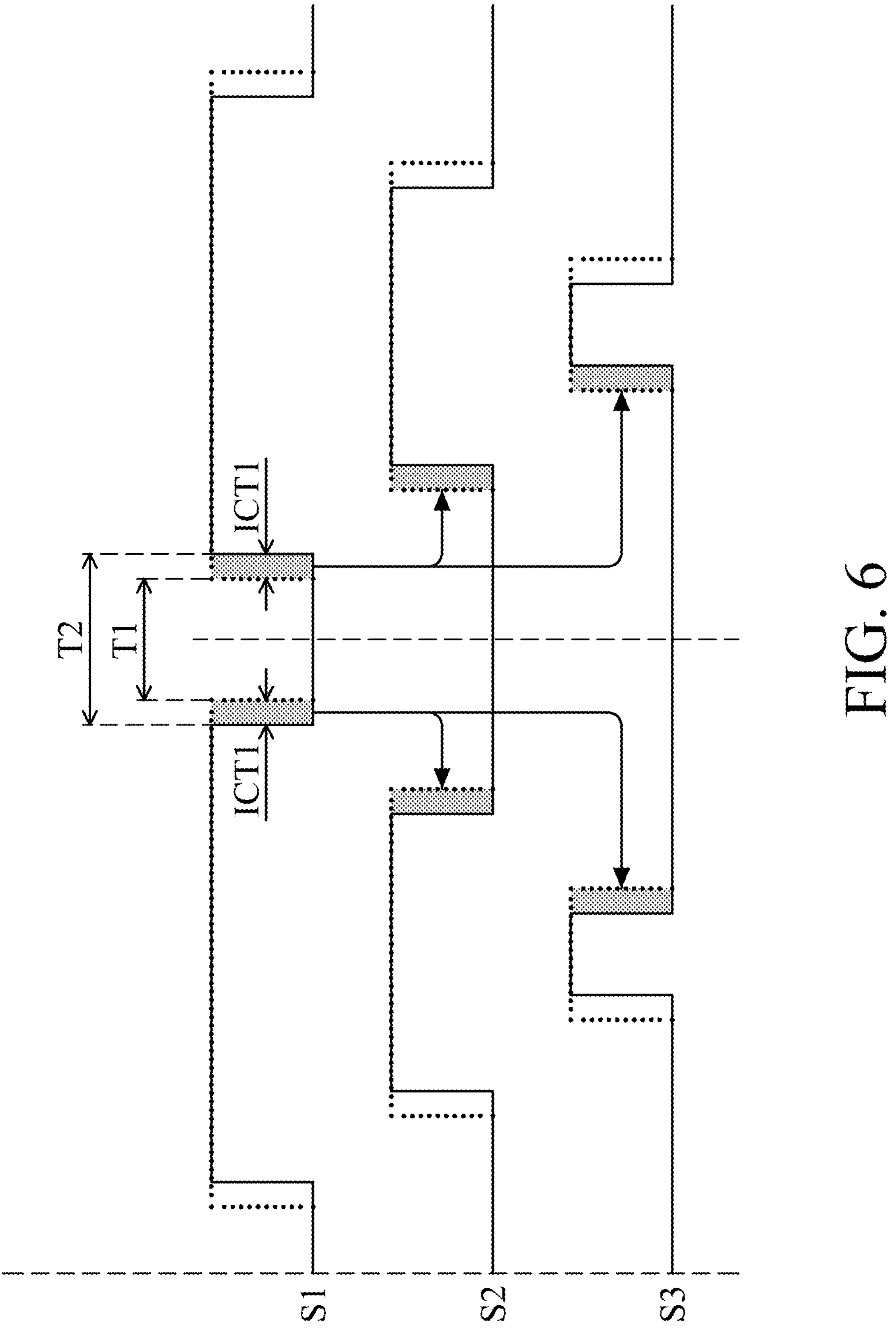
FIG. 6 is a schematic diagram showing a compensation method for the conduction period of the lower arm of an inverter in accordance with an embodiment of the present invention.

As shown in FIG. 6, when the controller 110 in FIG. 1 determines that the first conduction period T1 is the minimum conduction period and less than the lower limit value LVL in FIG. 5B during the first lower arm LA1, the second lower arm LA2, and the third lower arm LA3 are simultaneously turned on, the controller 110 increases the first conduction period T1 to the second conduction period T2 and adds the first change amount ICT1 to the second phase signal S2 and the third phase signal S3 respectively, so that the effective vector formed by the first phase signal S1, the second phase signal S2, and the third phase signal S3 remains unchanged.

According to an embodiment of the present invention, the second conduction period T2 is equal to the lower limit set value SETL in FIG. 5B. According to an embodiment of the present invention, the first change amount ICT1 is half of the difference between the second conduction period T2 and the first conduction period T1.

Figure 7:
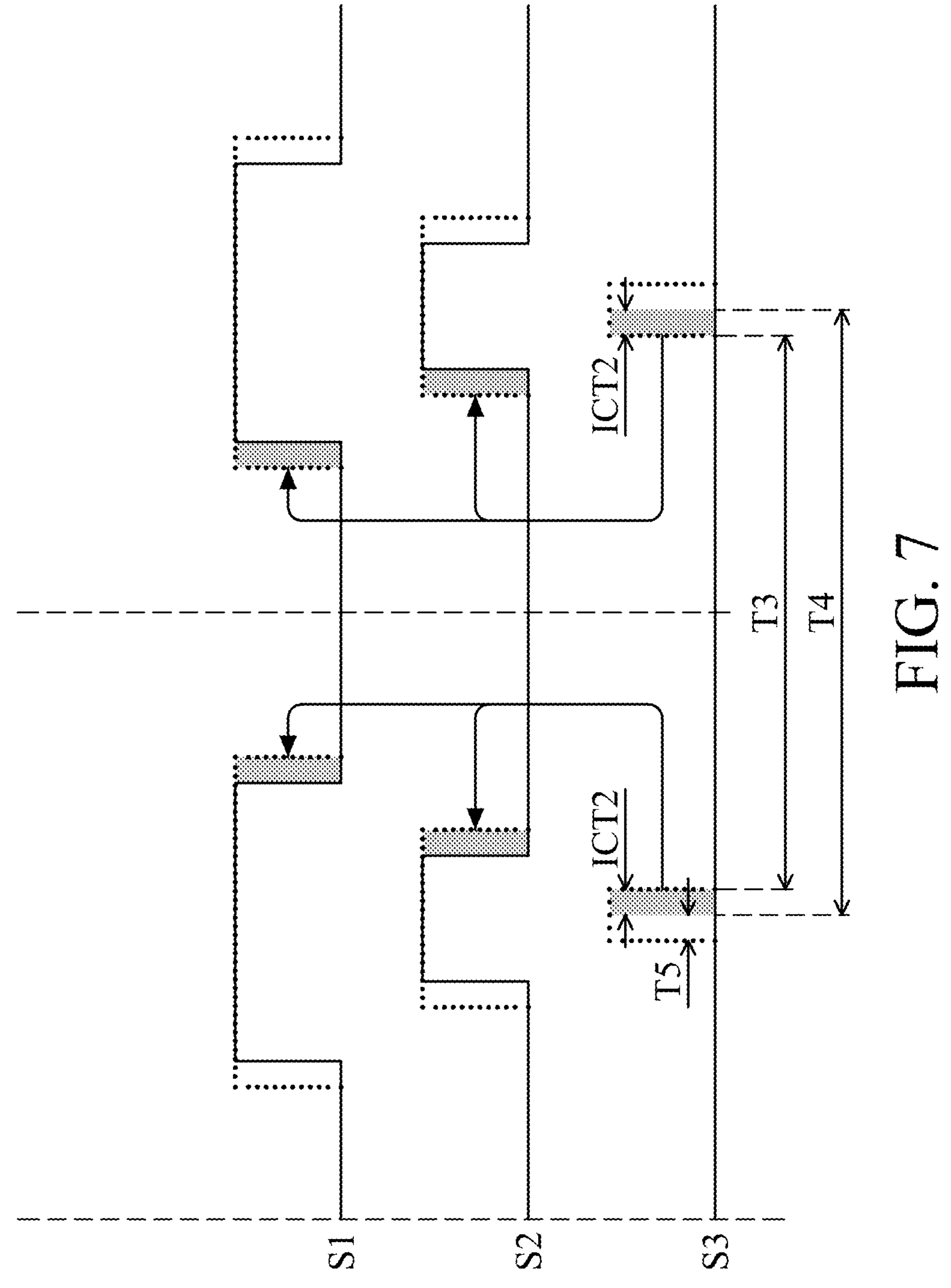
FIG. 7 is a schematic diagram showing a compensation method for the conduction period of the lower arm of an inverter in accordance with another embodiment of the present invention.

As shown in FIG. 7, when the controller 110 in FIG. 1 determines that the maximum conduction period is the third conduction period T3 that is greater than the upper limit LVH in FIG. 5B during the first lower arm LA1, the second lower arm LA2, and the third lower arm LA3 are expected to be turned on simultaneously, the controller 110 increases the third conduction period T3 to the fourth conduction period T4 and increases the first phase signal S1 and the second phase signal S2 by a second change amount ICT2 respectively, so that the effective vector formed by the first phase signal S1, the second phase signal S2, and the third phase signal S3 remains unchanged.

According to an embodiment of the present invention, the fourth conduction period T4 is equal to the upper limit set value SETH in FIG. 5B. According to an embodiment of the present invention, the second change amount ICT2 is half of the difference between the fourth conduction period T4 and the third conduction period T3.

According to an embodiment of the present invention, when the maximum conduction period of the first lower arm LA1, the second lower arm LA2, and the third lower arm LA3 is greater than the upper limit LVH during the first lower arm LA1, the second lower arm LA2, and the third lower arm LA3 are simultaneously turned on, it represents that the minimum conduction period (i.e., the fifth conduction period T5) during the first upper arm UA1, the second upper arm UA2, and the third upper arm UA3 are simultaneously turned on is too small, and the upper arm with a too small conduction period is directly not turned on.

According to an embodiment of the present invention, when the conduction period of any one of the first upper arm UA1, the second upper arm UA2, and the third upper arm UA3 is too small, a reflected wave may be formed in the motor 10 and cause the stator of the motor 10 to be overvoltage. In order to avoid this effect, it is necessary to adjust the conduction period of any one of the first upper arm UA1, the second upper arm UA2, and the third upper arm UA3 that is less than the second lower limit value, and compensate the adjusted change amount to other upper arms to keep the output vector the same.

Figure 8:
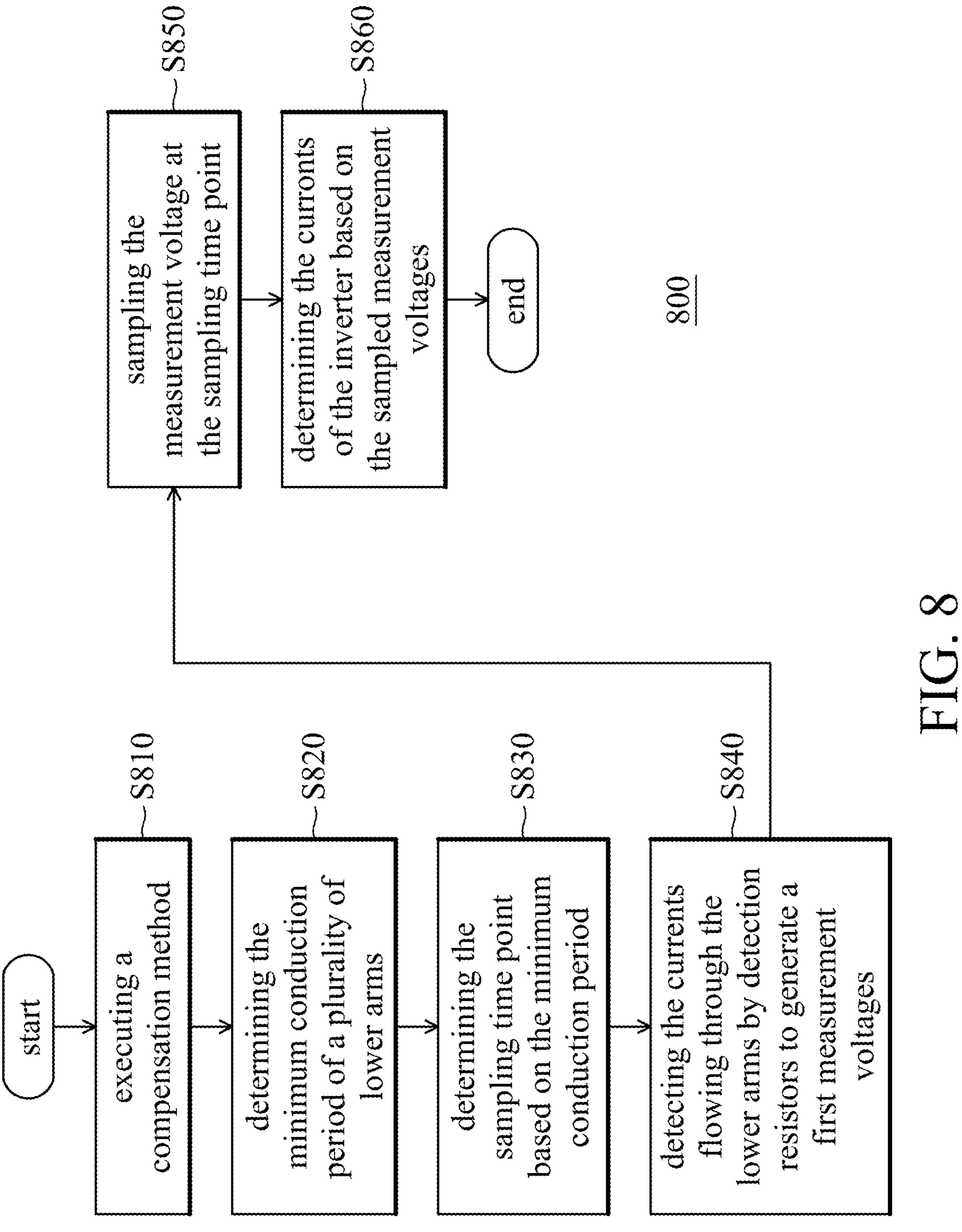
FIG. 8 is a flow chart showing a current detection method in accordance with an embodiment of the present invention.

The following description of the current detection method 800 in FIG. 8 will be combined with the block diagram in FIG. 1 for detailed explanation. First, the controller 110 executes a compensation method (Step S810) to compensate the conduction periods of the first lower arm LA1, the second lower arm LA2, and the third lower arm LA3 of the inverter 120.

Figure 9:
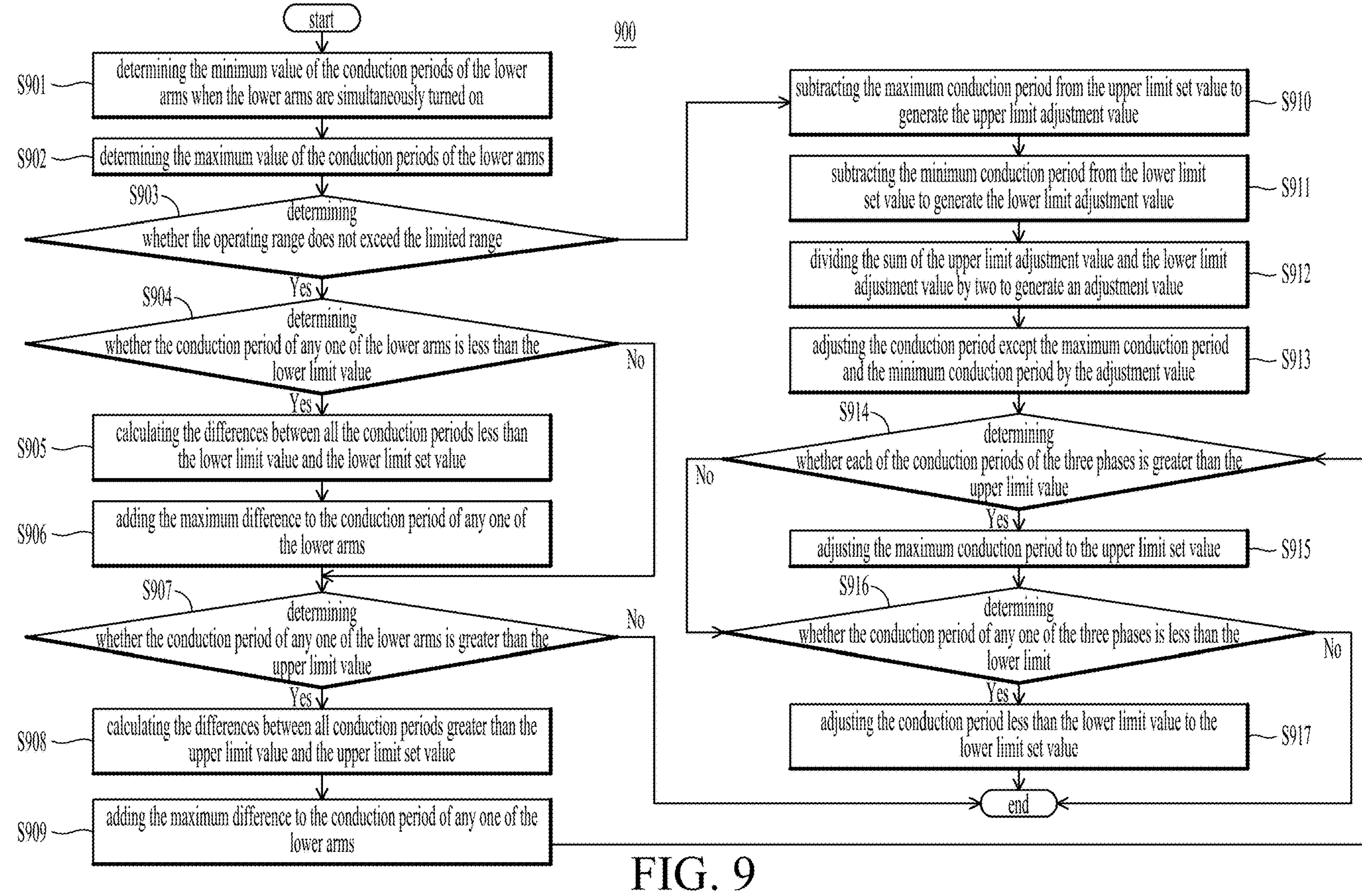
FIG. 9 is a flow chart showing a compensation method in accordance with an embodiment of the present invention.

The following description of the compensation method 900 in FIG. 9 will be combined with the block diagram in FIG. 1, FIGS. 5A-5B, FIG. 6, and FIG. 7 for detailed explanation.

First, when the first lower arm LA1, the second lower arm LA2, and the third lower arm LA3 of the inverter 120 are simultaneously turned on, the controller 110 determines the minimum value of the conduction period of the first lower arm LA1, the second lower arm LA2, and the third lower arm LA3 (Step S901), and determines the maximum value of the conduction period of the first lower arm LA1, the second lower arm LA2, and the third lower arm LA3 (Step S902).

As shown in the embodiment of FIG. 6, the minimum value of the conduction period of the first lower arm LA1, the second lower arm LA2, and the third lower arm LA3 is the first time T1 that occurs in the first phase signal S1, and the maximum value of the conduction period of the first lower arm LA1, the second lower arm LA2, and the third lower arm LA3 occurs when the third phase signal S3 is at a low logic level.

Next, the controller 110 determines whether the operating range does not exceed the limited range (Step S903). According to an embodiment of the present invention, the controller 110 calculates the difference between the maximum value and the minimum value of the conduction periods of the first lower arm LA1, the second lower arm LA2, and the third lower arm LA3 as the operating range, and calculates the difference between the upper limit set value SETH and the lower limit set value SETL shown in FIG. 5B as the limited range.

When it is determined in Step S903 that the operating range does not exceed the limited range, the controller 110 further determines whether the conduction period of any one of the first lower arm LA1, the second lower arm LA2, and the third lower arm LA3 is less than the lower limit value LVL in FIG. 5B (Step S904). When it is determined in Step S904 that the conduction period of any one of the first lower arm LA1, the second lower arm LA2, and the third lower arm LA3 is less than the lower limit value LVL, the controller 110 calculates the differences between all the conduction periods less than the lower limit value LVL and the lower limit set value SETL (Step S905).

The controller 110 further determines that the maximum value of all differences obtained in Step S905 is the maximum difference, and adds the maximum difference to all the conduction periods of the first lower arm LA1, the second lower arm LA2 and the third lower arm LA3 (Step S906). In the embodiment of FIG. 5B, when the controller 110 determines that the first time T1 of the first phase signal S1 is less than the lower limit value LVL, the controller 110 calculates the first difference between the lower limit set value SETL and the first time T1, and adds the first difference between the lower limit set value SETL and the first time T1 to all the conduction periods of the first lower arm LA1, the second lower arm LA2, and the third lower arm LA3. According to an embodiment of the present invention, the first difference between the lower limit set value SETL and the first time T1 is equal to twice of the first change amount ICT1, and the second time T2 is equal to the lower limit set value SETL and also equal to the lower limit value LVL at the same time.

According to another embodiment of the present invention, when the controller 110 further determines that the time when the second phase signal S2 is at a low logic level (that is, the conduction period of the second lower arm LA2) is also less than the lower limit value LVL, the controller 110 further calculates the second difference between the lower limit set value SETL and the time when the second phase signal S2 is at the low logic level, and determines that the maximum difference of the first difference and the second difference.

In this embodiment, since the conduction period of the first lower arm LA1 is less than the conduction period of the second lower arm LA2, the first difference is the maximum difference. Subsequently, the controller 110 adds the maximum difference, that is, the first difference, to all the conduction periods of the first lower arm LA1, the second lower arm LA2, and the third lower arm LA3.

Returning to the compensation method 900, after Step S906, the controller 110 determines whether the conduction period of any one of the first lower arm LA1, the second lower arm LA2, and the third lower arm LA3 is greater than the upper limit value LVH of FIG. 5B and less than the cycle period of the carrier (Step S907). When it is determined in Step S907 that the conduction period of any one of the first lower arm LA1, the second lower arm LA2, and the third lower arm LA3 is greater than the upper limit value LVH, the controller 110 calculates the differences of all conduction periods greater than the upper limit value LVH and the upper limit set value SETH (Step S908). When it is determined in Step S907 that the conduction period of any one of the first lower arm LA1, the second lower arm LA2, and the third lower arm LA3 is not greater than the upper limit value LVH, the compensation method 900 ends.

After step S908, the controller 110 further determines the maximum value of all differences as the maximum difference, and adds the maximum difference to all the conduction periods of the first lower arm LA1, the second lower arm LA2, and the third lower arm LA3 (Step S909). In the embodiment of FIG. 7, when the controller 110 determines that the third time T3 of the third phase signal S3 is greater than or equal to the upper limit value LVH, the controller 110 calculates a third difference of the third time T3 and the upper limit set value SETH, and adds the third difference to all the conduction periods of the first lower arm LA1, the second lower arm LA2, and the third lower arm LA3. According to an embodiment of the present invention, the third difference between the third time T3 and the upper limit set value SETH is equal to twice of the second change amount ICT2, and the fourth time T4 is equal to the upper limit set value SETH.

According to another embodiment of the present invention, when the controller 110 further determines that the time when the second phase signal S2 is at a low logic level (that is, the conduction period of the second lower arm LA2) is also greater than the upper limit value LVH, the controller 110 further calculates a fourth difference between the conduction period of the second lower arm LA2 and the upper limit set value SETH, and determines the maximum value of the third difference and the fourth difference as the maximum difference.

In this embodiment, since the conduction period of the third lower arm LA3 is greater than the conduction period of the second lower arm LA2, the third difference is the maximum difference. Subsequently, the controller 110 adds the maximum difference, that is, the third difference, to all the conduction periods of the first lower arm LA1, the second lower arm LA2, and the third lower arm LA3.

According to other embodiments of the present invention, Steps S907 to S909 can also be regarded as compensating the minimum conduction period of the first upper arm UA1, the second upper arm UA2 and the third upper arm UA3 in FIG. 1, which will not be repeatedly described herein. After Step S909, the controller 110 again determines whether the conduction periods of the first lower arm LA1, the second lower arm LA2, and the third lower arm LA3 is greater than the upper limit value LVH (Step S914) to confirm whether the compensated conduction periods of the first upper arm UA1, the second upper arm UA2 and the third upper arm UA3 need to be compensated again. The detailed Steps S914 to S917 will be described in detail below.

Returning to Step S904, when it is determined that the conduction period of any one of the first lower arm LA1, the second lower arm LA2, and the third lower arm LA3 is not less than the lower limit value LVL, the controller 110 executes Step S907. Returning to Step S903, when it is determined that the operating range is greater than the limited range, the controller 110 subtracts the maximum conduction period of the first lower arm LA1, the second lower arm LA2, and the third lower arm LA3 from the upper limit set value SETH to generate a upper limit adjustment value (Step S910).

Next, the controller 110 also subtracts the minimum conduction period of the first lower arm LA1, the second lower arm LA2, and the third lower arm LA3 from the lower limit set value SETL to generate a lower limit adjustment value (Step S911). Next, the controller 110 adds the upper limit adjustment value and the lower limit adjustment value and then divides the sum by two to generate an adjustment value (Step S912). Subsequently, the controller 110 uses the adjustment value to adjust the conduction period(s) except the maximum conduction period and the minimum conduction period (Step S913).

After step S913, the controller 110 determines whether the conduction period of the three phases is greater than the upper limit value LVH (Step S914). When the conduction period of any phase is greater than the upper limit value LVH, the controller 110 adjusts the conduction period greater than the upper limit value LVH to the upper limit set value SETH (Step S915). The controller 110 further determines whether the conduction period of any one of the three phases is less than the lower limit LVL (Step S916). When the conduction period of any phase is less than the lower limit value LVL, the controller 110 adjusts the conduction period less than the lower limit value LVL to the lower limit set value SETL (Step S917).

Returning to Step S914, when the controller 110 determines that the conduction period of any phase is not greater than the upper limit value LVH, the controller 110 executes Step S916. When the controller 110 determines in Step S916 that the conduction period of any phase is not less than the lower limit value LVL, the controller 110 ends the compensation method 900.

Figure 10:
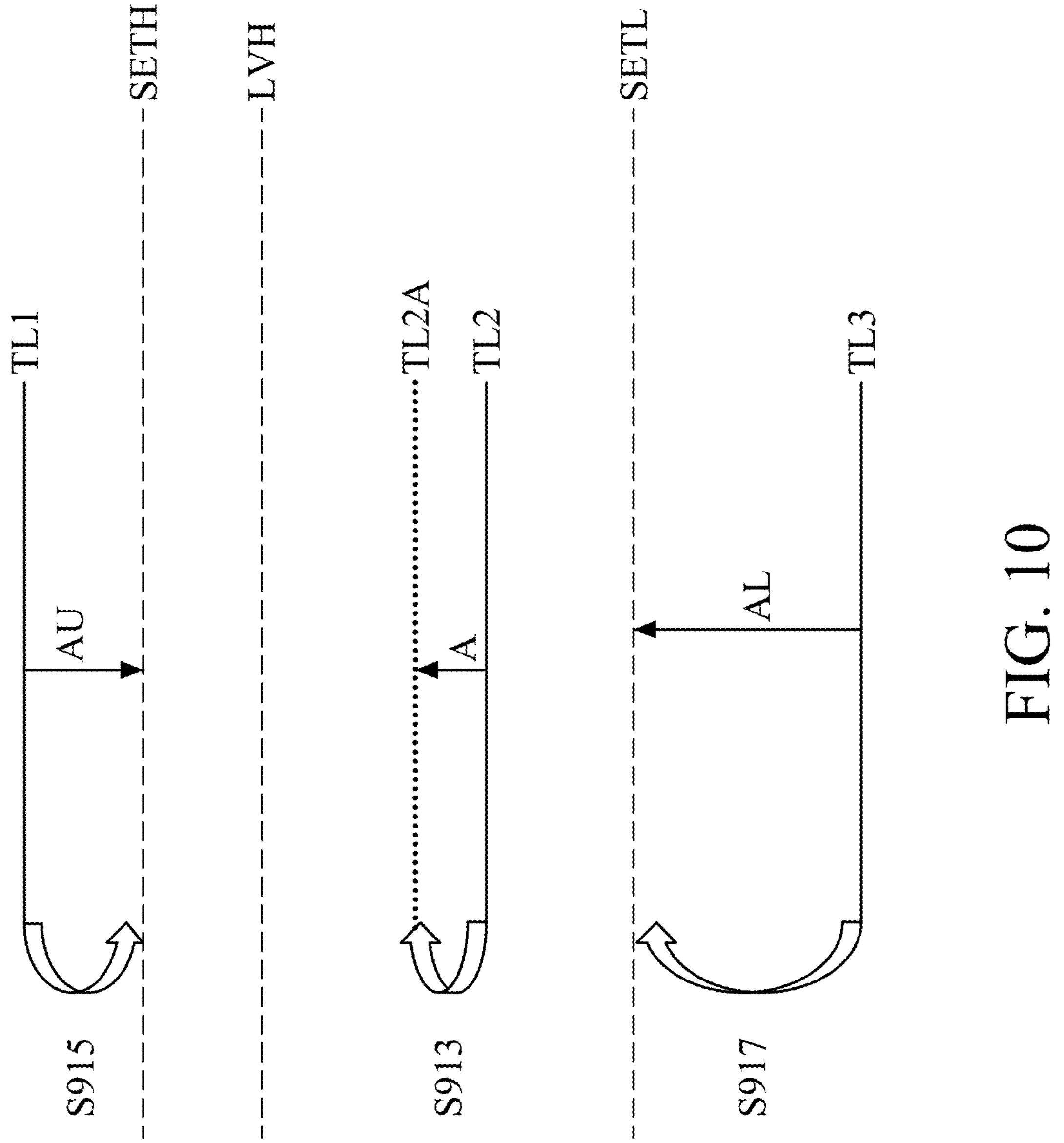
FIG. 10 is a schematic diagram showing a compensation method in accordance with an embodiment of the present invention.

As shown in FIG. 10, the conduction period of the first lower arm LA1, the second lower arm LA2, and the third lower arm LA3 in FIG. 1 are the first lower arm conduction period TL1, the second lower arm conduction period. TL2, and the third lower arm conduction period TL3 respectively. In addition, the first lower arm conduction period TL1 is greater than the upper limit value LVH, and the third lower arm conduction period TL3 is less than the lower limit set value SETL.

In step S910, the controller 110 calculates the upper limit adjustment value AU. In step S911, the controller 110 calculates the lower limit adjustment value AL. According to an embodiment of the present invention, the upper limit adjustment value AU and the lower limit adjustment value AL are both vectors with numerical value and directionality. In step S912, the controller 110 calculates the adjustment value A using Eq. 2:

$$\vec{A} = \frac{\overrightarrow{AU} + \overrightarrow{AL}}{2} \quad \text{(Eq. 2)}$$

Next, in Step S913, the controller 110 adjusts the second lower arm conduction period TL2 to the adjusted second lower arm conduction period TL2A according to the adjustment value A. In Steps S915 and S917, the controller 110 adjusts the first lower arm conduction period TL1 to the upper limit set value SETH and adjusts the third lower arm conduction period TL3 to the lower limit set value SETL. In the embodiment of FIG. 10, since the absolute value of the lower limit adjustment value AL is greater than the absolute value of the upper limit adjustment value AU in FIG. 10, the second lower arm conduction period TL2 moves toward the upper limit set value SETH.

Although the first conduction period TL1 exceeds the upper limit value LVH and the third conduction period TL3 also exceeds the lower limit value LVL, by adjusting the second conduction period TL2 in proportion, it helps to keep the effective vector formed by the first phase signal S1, the second phase signal S2, and the third phase signal S3 identical.

Returning to Step S810 in FIG. 8, after executing the compensation method 900, Step S820 is performed, in which the controller 110 determines the minimum conduction period for each of the lower arms (i.e., the first lower arm LA1, the second lower arm LA2, and the third lower arm LA3). According to some embodiments of the present invention, since the minimum conduction period and the maximum conduction period may have been adjusted by the compensation method 900, it is necessary to determine the minimum conduction period of the first lower arm LA1, the second lower arm LA2, and the third lower arm LA3 in Step S820 again.

Next, the controller 110 determines the sampling time point SP based on the minimum conduction period (Step S830). As shown in the embodiment of FIG. 3, when the controller 110 determines that the time when the first phase signal S1 at a low logic level is the minimum conduction period MCT (that is, the conduction period of the first lower arm LA1 is the minimum conduction period MCT), the controller 110 determines that the sampling time point SP is located in the minimum conduction period MCT.

According to an embodiment of the present invention, the sampling period TSP is approximately the minimum conduction period MCT, and the minimum conduction period MCT is equal to the stabilization period TST of the filter FLT. According to some embodiments of the present invention, the controller 110 further determines the sampling time point SP according to the limit of the amplification gain G of the amplifier AMP. According to other embodiments of the present invention, the controller 110 may also determine whether the sampling period TSP is less than half of the stabilization period TST according to the limit of the amplification gain G.

Subsequently, a first resistor R1, a second resistor R2, and a third resistor R3 are configured to detect the current flowing through the first lower arm LA1, the second lower arm LA2, and the third lower arm LA3 to generate a first measurement voltage VR1, a second measurement voltage VR2 and a third measurement voltage VR3 respectively (Step S840). Furthermore, the controller 110 samples the first measurement voltage VR1, the second measurement voltage VR2, and the third measurement voltage VR3 at the sampling time point SP (Step S850).

In the embodiment of FIG. 1, the amplifier AMP of the feedback circuit 130 amplifies the first measurement voltage VR1, the second measurement voltage VR2, and the third measurement voltage VR3, and the filter FLT filters the amplified signals to generate the first feedback voltage VF1, the second feedback voltage VF2, and the third feedback voltage VF3 accordingly. Then, the controller 110 uses the trigger signal TRG to trigger the analog-to-digital converter 140 to sample the first feedback voltage VF1, the second feedback voltage VF2, and the third feedback voltage VF3 to generate the digital current signal SDC.

Finally, the controller 110 determines the current flowing through the first lower arm LA1, the second lower arm LA2, and the third lower arm LA3 based on the sampled measurement voltage (Step S860). As shown in the embodiment of FIG. 1, the controller 110 learns the currents flowing through the first lower arm LA1, the second lower arm LA2, and the third lower arm LA3 based on the digital current signal SDC and the relationship between the digital current signal SDC, the sampling period, and the current in the lookup table 111.

A current measurement method and a compensation method for an inverter are proposed herein. By limiting the minimum conduction period of the lower arms and the upper arms, and compensating for the adjustment of the conduction period, there is always a zero vector in each electrical cycle for simultaneously detecting the currents of three phases. In addition, by selecting the sampling time point and compensating for the attenuation of the filter, it not only helps to further shorten the minimum conduction period, but also can accurately obtain the currents flowing through the lower arms during the minimum conduction period.

Although some embodiments of the present disclosure and their advantages have been described in detail, it should be understood that various changes, substitutions and alterations can be made herein without departing from the spirit and scope of the disclosure as defined by the appended claims. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A current detection method adapted to an inverter, comprising:

executing a compensation method, wherein the compensation method comprises:

determining whether the conduction periods of any one of the lower arms is less than a lower limit value when the lower arms are turned on simultaneously;

calculating a first difference when it is determined that a first conduction period of a first lower arm of the inverter is less than the lower limit value, wherein the first difference is equal to a difference between a lower limit set value and the first conduction period; and adding the first difference to all the conduction periods of other lower arms of the inverter;

determining that a plurality of lower arms have a minimum conduction period when the lower arms of the inverter are turned on simultaneously;

determining a sampling time point according to the minimum conduction period, wherein a sampling period is defined as a period from a starting point of the minimum conduction period to the sampling time point, wherein the sampling period is close to the minimum conduction period;

simultaneously detecting currents flowing through the lower arms by a plurality of detection resistors to generate a plurality of measurement voltages;

sampling the measurement voltages at the sampling time point; and determining currents of the inverter according to the sampled measurement voltages.

2. The current detection method as defined in claim 1, wherein the step of determining the currents of the inverter according to the sampled measurement voltages further comprises:

individually filtering the measurement voltages by a plurality of filters to generate a plurality of feedback voltages.

3. The current detection method as defined in claim 1, wherein the step of determining the currents of the inverter according to the sampled measurement voltages further comprises:

amplifying the measurement voltages with an amplification gain by a plurality of amplifiers to generate a plurality of amplified voltages; and individually filtering the amplified voltages by a plurality of filters to generate a plurality of feedback voltages;

wherein the filters have a stabilization period so that the feedback voltages output by the filters are close to the corresponding amplified voltages after the stabilization period;

wherein the minimum conduction period is equal to the stabilization period;

wherein the sampling period is less than the stabilization period.

4. The current detection method as defined in claim 3, wherein a feedback error is a first ratio of the measurement voltages, and a background noise is a second ratio of the measurement voltages;

wherein the first ratio is the second ratio multiplied by the amplification gain.

5. The current detection method as defined in claim 3, wherein the step of determining the currents of the inverter according to the sampled measurement voltages further comprises:

retrieving a lookup table according to the feedback voltages and the sampling period to obtain the currents of the inverter.

6. The current detection method as defined in claim 1, wherein the compensation method further comprises:

calculating a second difference when it is determined that a second conduction period of a second lower arm of the inverter is less than the lower limit value, wherein the second difference is equal to a difference between the lower limit set value and the second conduction period;

designating a maximum value of the first difference and the second difference as a maximum difference; and adding the maximum difference to all the conduction periods of the lower arms.

7. The current detection method as defined in claim 1, wherein the compensation method further comprises:

determining whether the conduction periods of the lower arms exceed an upper limit value;

calculating a second difference when it is determined that a second conduction period of a second lower arm of the inverter exceeds the upper limit value, wherein the second difference is equal to a difference between an upper limit set value and the second conduction period; and adding the second difference to all the conduction periods of the lower arms.

8. The current detection method as defined in claim 7, wherein the compensation method further comprises:

calculating a third difference when it is determined that a third conduction period of a third lower arm of the inverter exceeds the upper limit value, wherein the third difference is equal to a difference between the upper limit set value and the third conduction period;

designating a maximum value of the second difference and the third difference as a maximum difference; and adding the maximum difference to all the conduction periods of the lower arms.

9. The current detection method as defined in claim 1, wherein the compensation method further comprises:

determining that there is a maximum conduction period of the lower arms when the lower arms are simultaneously turned on;

calculating a difference between the maximum conduction period and the minimum conduction period as an operating range;

determining whether the operating range is less than a limited range, wherein the limited range is a difference between an upper limit set value and the lower limit set value;

subtracting the upper limit set value from the maximum conduction period to generate an upper limit adjustment value when the operating range exceeds the limited range;

subtracting the minimum conduction period from the lower limit set value to generate a lower limit adjustment value when the operating range exceeds the limited range;

dividing a sum of the upper limit adjustment value and the lower limit adjustment value by 2 to generate an adjustment value;

adjusting the conduction periods of the lower arms of the inverter other than the maximum conduction period and the minimum conduction period by the adjustment value;

adjusting the corresponding conduction period to the upper limit set value when the conduction period of any one of the lower arms exceeds the upper limit value; and adjusting the corresponding conduction period to the lower limit set value when the conduction period of any one of the lower arms less than the lower limit value.

10. A current detection method adapted to an inverter, comprising:

executing a compensation method, wherein the compensation method comprises:

determining whether conduction periods of a plurality of lower arms of the inverter are lower than a lower limit value when the lower arms are turned on simultaneously;

calculating a first difference when it is determined that a first conduction period of a first lower arm of the inverter is less than the lower limit value, wherein the first difference is equal to a difference between a lower limit set value and the first conduction period; and adding the first difference to all the conduction periods of other lower arms of the inverter;

updating a minimum conduction period of the lower arms after the compensation method is executed;

simultaneously detecting the currents flowing through the lower arms by a plurality of detection resistors to generate a plurality of measurement voltages during the minimum conduction period; and determining the currents of the inverter according to the measurement voltages.

11. The current detection method as defined in claim 10, wherein the compensation method further comprises:

calculating a second difference when it is determined that a second conduction period of a second lower arm of the inverter is less than the lower limit value, wherein the second difference is equal to a difference between the lower limit set value and the second conduction period;

designating a maximum value of the first difference and the second difference as a maximum difference; and adding the maximum difference to all the conduction periods of the lower arms.

12. The current detection method as defined in claim 10, wherein the compensation method further comprises:

determining whether the conduction periods of the lower arms exceed an upper limit value when the lower arms are turned on simultaneously;

calculating a second difference when it is determined that a second conduction period of a second lower arm of the inverter exceeds the upper limit value, wherein the second difference is equal to a difference between an upper limit set value and the second conduction period; and adding the second difference to all the conduction periods of the lower arms.

13. The current detection method as defined in claim 12, wherein the compensation method further comprises:

calculating a third difference when it is determined that a third conduction period of a third lower arm of the inverter exceeds the upper limit set value, wherein the third difference is equal to a difference between the upper limit value and the third conduction period;

designating a maximum value of the second difference and the third difference as a maximum difference; and adding the maximum difference to all the conduction periods of all the lower arms.

14. The current detection method as defined in claim 10, wherein the compensation method further comprises:

determining that the lower arms have a maximum conduction period when the lower arms are turned on simultaneously;

calculating a difference between the maximum conduction period and the minimum conduction period as an operating range;

determining whether the operating range does not exceed a limited range, wherein the limited range is a difference of an upper limit set value and the lower limit set value;

subtracting the upper limit set value from the maximum conduction period to generate an upper limit adjustment value when the operating range exceeds the limited range;

subtracting the minimum conduction period from the lower limit set value to generate a lower limit adjustment value when the operating range exceeds the limited range;

dividing a sum of the upper limit adjustment value and the lower limit adjustment value by 2 to generate an adjustment value;

adjusting the conduction periods of the inverter other than the maximum conduction period and the minimum conduction period by the adjustment value;

adjusting the corresponding conduction period to the upper limit set value when the conduction period of any one of the lower arms exceeds the upper limit value; and adjusting the corresponding conduction period to the lower limit set value when the conduction period of any one of the lower arms is less than the upper limit value.

15. The current detection method as defined in claim 10, further comprising:

determining a sampling time point according to the minimum conduction period, wherein a sampling period is defined as a period from a starting point of the minimum conduction period to the sampling time point, wherein the sampling period is close to the minimum conduction period.

16. The current detection method as defined in claim 15, further comprising:

individually filtering the measurement voltages by a plurality of filters to generate a plurality of feedback voltages.

17. The current detection method as defined in claim 16, further comprising:

amplifying the measurement voltages with an amplification gain by a plurality of amplifiers to generate a plurality of amplified voltages; and individually filtering the amplified voltages by the plurality of filters to generate the feedback voltages;

wherein the filters have a stabilization period, so that the feedback voltages output by the filters are close to the amplified voltages after the stabilization period;

wherein the minimum conduction period is equal to the stabilization period;

wherein the sampling period is less than the stabilization period.

18. The current detection method as defined in claim 17, wherein a feedback error is a first ratio of the measurement voltages and a background noise is a second ratio of the measurement voltages;

wherein the first ratio is the second ratio multiplied by the amplification gain.

19. The current detection method as defined in claim 17, further comprising:

retrieving a lookup table to obtain the currents of the inverter according to the feedback voltages and the sampling period.

* * * * *